United States Patent
Bessonov et al.

(10) Patent No.: US 11,837,677 B2
(45) Date of Patent: Dec. 5, 2023

(54) P-I-N PHOTODETECTOR

(71) Applicant: EMBERION OY, Espoo (FI)

(72) Inventors: Alexander Bessonov, Cambridge (GB); Mark Allen, Cambridge (GB)

(73) Assignee: EMBERION OY, Espoo (FI)

( * ) Notice: Subject to any disclaimer, the term of this patent is extended or adjusted under 35 U.S.C. 154(b) by 296 days.

(21) Appl. No.: 17/298,359

(22) PCT Filed: Nov. 28, 2019

(86) PCT No.: PCT/FI2019/050849
§ 371 (c)(1),
(2) Date: May 28, 2021

(87) PCT Pub. No.: WO2020/109664
PCT Pub. Date: Jun. 4, 2020

(65) Prior Publication Data
US 2022/0102570 A1    Mar. 31, 2022

(30) Foreign Application Priority Data
Nov. 30, 2018 (GB) ..................... 1819524

(51) Int. Cl.
*H01L 31/105* (2006.01)
*H01L 31/0224* (2006.01)

(52) U.S. Cl.
CPC .... *H01L 31/105* (2013.01); *H01L 31/022408* (2013.01)

(58) Field of Classification Search
None
See application file for complete search history.

(56) References Cited

U.S. PATENT DOCUMENTS

| | | |
|---|---|---|
| 5,567,971 A | 10/1996 | Jackson et al. |
| 2007/0057144 A1 | 3/2007 | Asano |
| 2012/0031490 A1* | 2/2012 | Liu .............. H01L 31/1836 977/948 |
| 2012/0175593 A1* | 7/2012 | Murayama ........... H10K 30/35 257/E29.071 |
| 2013/0032782 A1 | 2/2013 | Gerasimos et al. |

(Continued)

FOREIGN PATENT DOCUMENTS

| | | |
|---|---|---|
| EP | 3136445 A1 | 3/2017 |
| EP | 3144980 A1 | 3/2017 |

(Continued)

OTHER PUBLICATIONS

Supplementary Search Report dated Jul. 18, 2022, corresponding to European Patent Application No. 19888981.

(Continued)

*Primary Examiner* — Evren Seven
(74) *Attorney, Agent, or Firm* — SQUIRE PATTON BOGGS (US) LLP

(57) ABSTRACT

A photodetector which comprises a measurement layer (15) and at least a first photoactive layer (11) which covers the measurement layer (15). The measurement layer (15) may be a transistor channel or a charge accumulation electrode. The conductivity type of the measurement layer is n-type, p-type or ambipolar and the first photoactive layer (11) exhibits intrinsic semiconductivity.

7 Claims, 4 Drawing Sheets

(56) References Cited

U.S. PATENT DOCUMENTS

| | | | |
|---|---|---|---|
| 2013/0146838 A1* | 6/2013 | Ku | H01L 31/06 257/13 |
| 2014/0077210 A1 | 3/2014 | Hekmatshoartabari et al. | |
| 2016/0035794 A1 | 2/2016 | Kim et al. | |
| 2016/0359062 A1 | 12/2016 | Heo et al. | |

FOREIGN PATENT DOCUMENTS

| | | |
|---|---|---|
| EP | 3707754 A1 | 9/2020 |
| EP | 3743947 A1 | 12/2020 |

OTHER PUBLICATIONS

International Search Report and Written Opinion dated Feb. 10, 2020 corresponding to International Patent Application No. PCT/FI2019/050849.

GB Search Report dated Apr. 16, 2019 corresponding to GB Application No. GB1819524.8.

* cited by examiner

P-I-N PHOTODETECTOR

FIELD OF THE DISCLOSURE

The present disclosure relates to photodetectors, and more particularly to photodetectors where the electrically active materials form a transistor structure or a voltage-mode device, and where most of the incident light is absorbed in a semiconducting absorber layer which overlies the measurement layer.

BACKGROUND OF THE DISCLOSURE

The quantum efficiency of a photodetector which utilizes semiconducting absorber layers depends on how much of the incident radiation the absorber layer can absorb and convert into electrical charge. The absorption efficiency depends on the bandgap of the absorber material, the wavelength of incoming radiation and the thickness of the depletion region of the absorber layer in the direction of incoming radiation. The thickness of the absorption layer may often be freely selected, but the built-in electric field at the junction between an absorber layer and a transistor channel still only extends as far as the depletion region.

The thickness of the depletion region is determined by the electron work functions of the absorber and the channel material. If the channel is formed from a highly conductive material, the absorber/channel junction will typically be a Schottky junction. If the channel is formed from a semiconducting material, the junction will typically be a pn-junction. High doping concentrations in the absorber material decrease the thickness of the depletion region.

Photodetectors configured for absorbing visible light can utilize absorber materials with bandgaps between 1-2 eV. This bandgap interval includes many materials with a broad range of band edge energy levels, which can be intentionally doped p-type or n-type, so Schottky junctions and pn-junctions with relatively thick depletion regions can often be created with these materials.

However, it is more difficult to configure sufficiently thick depletion regions in photodetectors for infrared light. Absorber materials in these photodetectors need a bandgap clearly below 1 eV to be able to absorb radiation at short-wave (SWIR) or mid-wave infrared (MWIR) wavelengths. According to a conventional classification which will be applied in this disclosure, SWIR wavelengths include the range 1 μm-3 μm, MWIR 3-5 μm and long-wave infrared (LWIR) includes wavelengths above 7 μm. The limits of these ranges are not absolute and other classifications are also possible.

Semiconductor nanocrystals have been employed as absorbers in infrared photodetectors. Such photoactive layers can donate charge carriers to a measurement layer when they are released in the photoactive absorber material by electromagnetic radiation. When electromagnetic radiation is absorbed in the photoactive layer, the photogenerated charges can be separated so that one charge-carrier type is trapped in the photoactive layer while another carrier type is transferred to the measurement layer.

The absorption of electromagnetic radiation in the photoactive layer can induce an increase or decrease in free charges in the measurement layer and thereby modulate either its conductivity or its electric potential. Photoactive layers can also expand the spectral response of photosensitive transistors and voltage-mode devices to a broader wavelength range. Document U.S. Pat. No. 8,803,128 discloses a semiconductor nanocrystal composite suitable for light absorption at infrared wavelengths.

However, in photodetectors that utilize semiconductor nanocrystals or thin-film materials for infrared absorption, the effective thickness of Schottky- or pn-junction depletion regions at the absorber/channel interface is typically limited to about 100 nm due to naturally high charge carrier density and poor electrical charge transport in nanocrystal solids. This limits the quantum efficiency of infrared photodetectors.

BRIEF DESCRIPTION OF THE DISCLOSURE

An object of the present disclosure is to provide an apparatus for alleviating the above disadvantages.

The object of the disclosure is achieved by an arrangement which is characterized by what is stated in the independent claims. The preferred embodiments of the disclosure are disclosed in the dependent claims.

The disclosure is based on the idea of building a p-i-n type doping profile in a semiconductor nanocrystal absorber and the adjacent channel. The depletion region in the p-i-n absorber/channel heterojunction can be made significantly thicker than in Schottky- or pn-junctions, and the quantum efficiency of the photodetector at infrared wavelengths can thereby be improved.

BRIEF DESCRIPTION OF THE DRAWINGS

In the following the disclosure will be described in greater detail by means of preferred embodiments with reference to the accompanying drawings, in which

FIGS. 2b and 2d illustrate electric fields in the device illustrated in FIG. 2a

DETAILED DESCRIPTION OF THE DISCLOSURE

Figure 1:
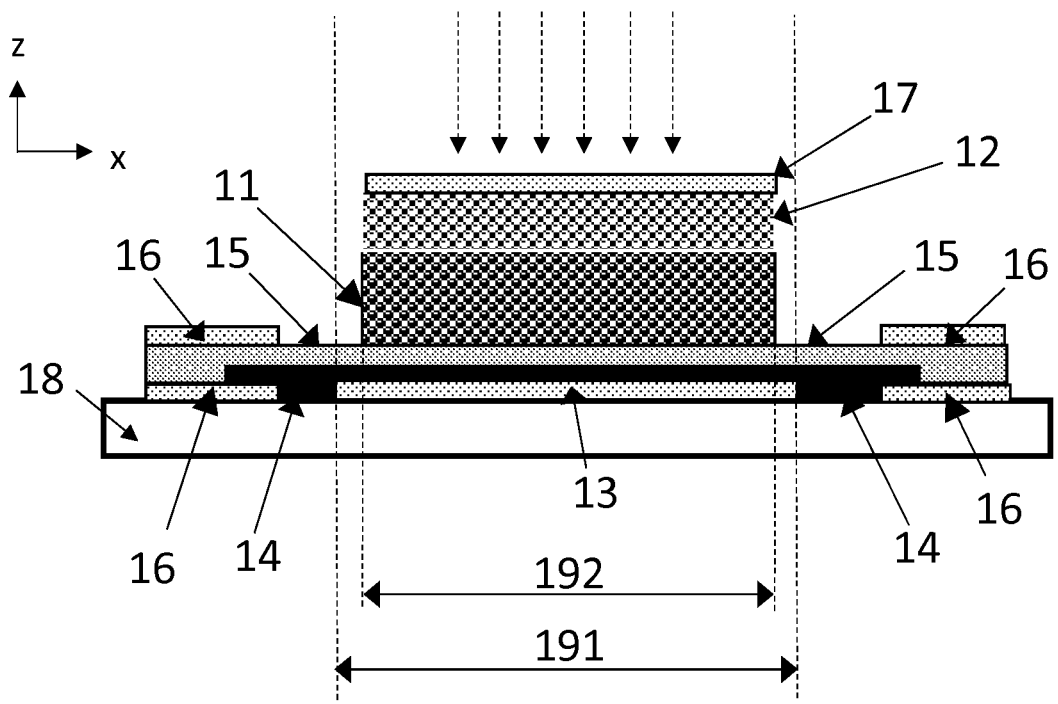
FIG. 1 illustrates a phototransistor.

This disclosure describes a photodetector which comprises a substrate with a horizontal substrate surface, an electrically conducting gate electrode which defines a first region on the horizontal substrate surface, and an insulating layer which covers the gate electrode in the first region on the horizontal surface. The photodetector also comprises a measurement layer which covers the insulating layer at least in the first region on the horizontal substrate surface. The photodetector also comprises a vertical stack of photoactive layers which comprises at least a first photoactive layer which covers the measurement layer at least in a second region on the horizontal substrate surface, wherein the second region at least partly overlaps with the first region. The conductivity type of the measurement layer may be n-type, p-type or ambipolar and the first photoactive layer exhibits intrinsic semiconductivity.

In this disclosure, terms such as "vertical" and "horizontal" do not imply anything about the orientation of the substrate when the device is manufactured, or when the device is in use. The device and the substrate may be oriented in any suitable direction during usage and manufacturing, for example sideways in such a manner that a plane which is in this disclosure referred to as "horizontal" becomes a vertical surface. In other words, the terms "horizontal" and "vertical" merely define two orthogonal directions. The horizontal direction is parallel to a main surface of the array substrate, and the vertical direction is normal to that main surface. In all figures of this disclosure, the horizontal device plane defined by the orientation of the array substrate is marked as an xy-plane, and the vertical direction is marked with a z-axis.

In this disclosure, a layer which "exhibits intrinsic semiconductivity" may either comprise a pure intrinsic semiconductor material, a material with compensation doping (where p-n), or it may comprise a stack of multiple lightly doped sublayers, some of which are p-doped and some of which are n-doped, so that the net p-type doping in the stack is approximately equal to the net n-type doping in the stack.

The vertical stack of photoactive layers may further comprise a second photoactive layer which covers the first photoactive layer at least in the second region on the horizontal substrate surface. The conductivity of the measurement layer may be n-type and the conductivity of the second photoactive layer p-type. Alternatively, the conductivity of the measurement layer may be p-type and the conductivity of the second photoactive layer n-type. Alternatively, the conductivity of the measurement layer may be ambipolar, and the conductivity of the second photoactive layer may in that case be either n-type or p-type.

In addition to direct physical contact, terms such as "in contact with" and "covers" can in this disclosure sometimes mean electrical contact without direct physical contact. In other words, when a photoactive layer, for example, is in contact with or covers a measurement layer, the photoactive layer can be physically separated from the measurement layer by an intermediate layer, but still be in contact with the measurement layer because the intermediate layer is sufficiently thin to allow charge carriers to pass through it. For example, the intermediate layer may be a host material wherein the semiconductor nanocrystals are embedded, or it may be a thin insulating or semiconducting layer on the surface of the measurement layer. If charge carriers can pass through the intermediate layer, for example by tunnelling, then the photoactive layer may still be considered to be "in contact with" the measurement layer.

Phototransistor Embodiment

The measurement layer may be a transistor channel, and the photodetector may comprise source and drain electrodes connected to different sides of the transistor channel. The photodetector can be configured to measure the intensity of incoming radiation by determining the magnitude of a source-drain current which is driven through the measurement layer between the source and drain electrodes. The source-drain current is modulated by the photoactive layer when it absorbs radiation. The source and drain electrodes form a double-ended pair of measurement electrodes.

FIG. 1 illustrates a photodetector which comprises a field-effect transistor structure, where the measurement layer is a transistor channel. The illustrated phototransistor may form one pixel in a photodetector which comprises an array of similar pixels. The photodetector comprises a substrate 18, a gate electrode 13 on the substrate surface and an insulating layer 14 which covers the gate electrode 13. The insulating layer may be called a gate-insulating layer. The gate electrode 13 defines a first region 191 on the surface of the substrate. The gate electrode is illustrated as layer on top of the substrate surface, the layer may alternatively be embedded into the substrate. In this case the part of the substrate which covers the gate electrode in the first region may be considered to be the insulating layer. The gate electrode may alternatively be a conducting via which extends vertically to the surface of the substrate in the first region. The gate electrode may in this case be covered by an insulating layer on the surface of the substrate.

The phototransistor in FIG. 1 also comprises a transistor channel 15 which covers the insulating layer at least in the first region 191. Source and drain electrodes 16 are connected to two opposite ends of the transistor channel electrode 15. The source and drain electrodes may be placed either immediately above the transistor channel or immediately below the channel, or both, as illustrated in FIG. 1. The geometry of the photodetector does not necessarily have to be linear as in FIG. 1. It may also be radial, so that one of the source and drain electrodes is located at a center point, surrounded by the transistor channel which is in turn surrounded by the other one of the source and drain electrodes.

The phototransistor in FIG. 1 also comprises a first photoactive layer 11 which covers the transistor channel 15 in a second region 192, and a second photoactive layer 12 which covers the first photoactive layer 11 in the same region. Optionally, the photodetector may also comprise a conducting or strongly doped top electrode 17 which covers the second photoactive layer 12 at least in the second region 192 on the horizontal substrate surface. The top electrode 17 may have the same conductivity type as the second photoactive layer 12, or configured to be unipolar, i.e. transporting only one carrier type.

The first region 191 may be coextensive with the second region 192. Alternatively, one of the regions may be larger than the other. The functions which are crucial to the operation of the phototransistor will in either case take place primarily in the area where the first region 191 overlaps with the second region 192.

The channel 15 may be a layer of two-dimensional material or a thin-film semiconducting layer, or a metal layer. It may be called a conducting channel and it may be either p-doped or n-doped, or exhibiting metallic conductivity, for example to a conductivity which lies in the range $10^{-2}$-$10^8$ S/m.

In this disclosure, graphene will be used as an example of a two-dimensional layered material. A conducting channel made of graphene may exhibit ambipolar conductivity.

Other two-dimensional layered materials, such as phosphorene (black phosphorous), silicene, germanene, stanene, GaN, InN, InP, InAs, BAs, BP, or GaP, may alternatively be used as channel materials in any embodiment presented in this disclosure. Furthermore, the two-dimensional layered material used in any embodiment presented in this disclosure may also be a transition metal dichalcogenide or transition metal oxide, which includes $WE_x$, $MoE_x$, $ScE_x$, $TiE_x$, $HfE_x$, $ZrE_x$, $VE_x$, $CrE_x$, $MnE_x$, $FeE_x$, $CoE_x$, $NiE_x$, $NbE_x$, $TcE_x$, $ReE_x$, $PdE_x$, or $PtE_x$, where E is O, S, Se or Te, where x is 0.5-3.5. The two-dimensional layered material may comprise 1-10 atomic layers, with the total thickness ranging from 0.3 nm to 10 nm.

When prepared as two-dimensional layered materials with semiconducting, or semimetal, or metal properties, all of these materials can be used as conducting channels in light-sensitive field-effect transistors.

The conducting channel 15 may alternatively be a thin-film semiconducting layer with a crystalline or amorphous structure. The thin-film semiconducting layer 15 may comprise a material selected from the groups: inorganic materials such as a-Si, p-Si, Ge, In—Ga—Zn—O (IGZO), In—Sn—Zn—O (ITZO), Y—In—Zn—O (YIZO), Al—In—Zn—O (AIZO), In—Zn—O (IZO), Zn—Sn—O (ZTO), Ga—Zn—O (GZO), ZnO, $In_2O_3$, $MoC_3$, $WC_3$, NiO, $Cu_2C$, $TiC_2$, $SnO_2$, PbS, PbSe, PbTe, CdS, CdSe, CdTe, ZnS, CuS, $Cu_2S$, $Cu_2Se$, CZTS, MnS, $Bi_2S_3$, $Ag_2S$, $Ag_2Se$, HgTe, HgCdTe, HgS, HgSe, GaSe, GaAs, $MoS_2$, $WS_2$, CIS, InAs, InSb, InP; or organic materials such as pentacene, pentacene derivative, rubrene, tetraceno[2,3-b]thiophene, a-sexithiophene, oligothiophene-fluorene family, regioregular(poly3-hexylthiophene), poly(3,3'''-didodecylquaterthiophene), poly(2,5-bis(3-decylthiophen-2-yl)thieno[3,2-b]thiophene), carbon nanotubes (CNT), $C_{60}$, hexadecafluoro copper phthalocyanine ($F_{16}CuPc$), naphthalene diimide and perylene diimide families.

The first photoactive layer 11 may consist of one semiconducting layer which exhibits intrinsic semiconductivity with a relatively low charge carrier concentration, for example below $10^{18}$ cm$^{-3}$, or below $10^{17}$ cm$^{-3}$, or below $10^{16}$ cm$^{-3}$. The electrical resistivity of the first photoactive layer 11 is relatively high. The first photoactive layer 11 may have a bandgap suitable for absorption of short wavelength infrared radiation. The bandgap of the first photoactive layer 11 is narrower than the bandgap of the second photoactive layer. Depending on which wavelengths the photodetector is optimized for, the bandgap of the first photoactive layer 11 may for example be smaller than 1.2 eV, or smaller than 1.0 eV, or smaller than 0.8 eV. The bandgap of the first photoactive layer determines the long-wavelength cutoff of the photoresponse. The layer 11 may be called an intrinsic absorption layer, or i-type absorption layer. Most of the radiation absorption takes place in this layer.

The second photoactive layer 12 may be called a contact layer, or a modulation doping layer. If the doping type of the channel 15 is p-type, then the second photoactive layer 12 may exhibit n-type conductivity. If, on the other hand, the doping type of the channel 15 is n-type, then the second photoactive layer 12 may exhibit p-type conductivity. If the measurement layer 15 is a layer of graphene with ambipolar conductivity, then the doping type of the second photoactive layer 12 may be either p-type or n-type. The second photoactive layer 12 may have a relatively high charge carrier concentration, for example greater than $10^{16}$ cm$^{-3}$, or greater than $10^{17}$ cm$^{-3}$, or greater than $10^{18}$ cm$^{-3}$, to enable modulation doping, or remote doping, or more specifically surface charge transfer doping to/from the first photoactive layer. The second photoactive layer 12 may enhance the built-in electric field of the heterojunction by donating electrons (if it is an n-type layer) or holes (if it is a p-type layer) to the first photoactive layer.

The second photoactive layer 12 may for example have a bandgap suitable for transmittance of short-wavelength infrared radiation, and absorption of visible range and near-infrared radiation. The bandgap of the second photoactive layer 12 is wider than the bandgap of the first photoactive layer. Depending on which wavelengths the photodetector is optimized for, the bandgap of the second photoactive layer 12 may for example be greater than 0.8 eV, or greater than 1.0 eV, or greater than 1.2 eV. The bandgap of the second photoactive layer 12 may for example be between 0.1 eV-0.9 eV greater than the bandgap of the first photoactive layer, or between 0.3 eV-0.6 eV greater than the bandgap of the first photoactive layer. The thickness of the second photoactive layer 12 may be in the range 10-500 nm or 50-200 nm. The bandgap of the second photoactive layer determines the short-wavelength cutoff of the photoresponse.

The photoactive layers may, for example, comprise semiconductor nanocrystals, nanoparticles or colloidal quantum dots selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, $Ag_2Se$, HgTe, HgCdTe, HgS, HgSe, GaSe, GaAs, $MoS_2$, $WS_2$, $Ti_2O_3$, CIS, InAs, InSb, InP, Ge, Si, graphene, or core/shell nanocrystals with any of the preceding core/shell constituents. Alternatively, the photoactive semiconducting layer may comprise any of the preceding semiconductor nanocrystals, nanoparticles or colloidal quantum dots embedded in a host material comprising metal chalcogenide, metal halide, or hybrid halide perovskite. The metal chalcogenide may have the general formula MEN, where E is S, Se or Te, and it may for example be $AsE_n$, $CdE_n$, $CuE_n$, $ZnE_n$, $SnE_n$, $SbE_n$, $InE_n$, $MoE_n$, or $BiE_n$. The metal halide may have the general formula $MX_n$, where M is Pb, Bi, Cd, In, Zn, Sn, Cu, Fe, Ga, Li or Sb and X is I, Br or Cl, and it may for example be $PbI_2$ or $BiI_3$. The hybrid halide perovskite may have the general formula $ABX_3$, where A is Cs, $CH_3NH_3$ or $NH_2CH=NH_2$, B is Pb or Sn, and X is Cl, Br or I.

The quantum dot loading in the host material may vary between 1% and 90%. The diameter of the semiconductor nanocrystals, nanoparticles or quantum dots may, for example, be in the range 2-100 nm.

The capping ligands on the above semiconductor nanocrystals, nanoparticles or colloidal quantum dots may comprise organic molecules or inorganic molecules, or a combination of both. Organic ligands may include, but are not limited to, alkyl or aryl thiols, such as 1,2-ethanedithiol, 3-mercaptopropionic acid, benzenethiol, etc. Organic ligands may also include alkyl or aryl amines, N-heterocycles, such as 1,2-ethylenediamine, pyridine, etc. Inorganic ligands may include atomic halogens (I, Br, Cl), pseudo halogens (SCN), or chalcogens (S, Se). Inorganic ligands may also include metal halides or metal chalcogenides.

The positions of the edges of the energy bands in nanocrystal semiconductors or colloidal quantum dots may be controlled by suitably chosen capping ligands, which introduce localized dipoles on their surface. The work function of the nanocrystal semiconductors or colloidal quantum dots may be controlled by suitably chosen capping ligands and/or chemical doping of the nanocrystal/quantum dot core.

The photoactive layers may alternatively comprise a thin-film semiconducting layer with a crystalline or amorphous structure. The thin-film semiconducting layers may comprise an inorganic material selected from the group: PbS, PbSe, PbTe, CdS, CdSe, CdTe, $Cd_3As_2$, ZnS, ZnO, CuS, $Cu_2S$, $Cu_2Se$, CZTS, MnS, $Bi_2S_3$, $Ag_2S$, $Ag_2Se$, HgTe, HgCdTe, HgS, HgSe, GaSe, GaAs, $MoS_2$, $WS_2$, $Ti_2O_3$, $VO_2$, $LaTiO_3$, $Sr_2VO_4$, $Sr_2CrO_4$, CIS, $InxGa_{1-x}As$, InAs, InSb, InP, Ge, Si; or organic small molecules, or organic polymers, or organic-inorganic hybrid materials.

The horizontal current driven by a source-drain voltage through the horizontal transistor channel 15 can be modulated not only by the gate voltage applied to gate electrode 13, but also by the illumination-dependent photovoltage produced in a vertical direction by the p-i-n heterojunction which is formed between the channel 15, the first photoactive layer 11 and the second photoactive layer 12.

The optional conductive top electrode 17, which should be at least partly transparent, may be used to control illumination-dependent response of the transistor more closely. In specific configurations of the p-i-n photodetector, the top electrode 17 or the gate electrode 13 may be effective in modulating the depletion width, or the amount of space charge in the i-type semiconductor, thus increasing or decreasing the magnitude of photoresponse. However, the width of the depletion layer in the p-i-n heterojunction may not necessarily vary much as a function of the voltage applied to the top electrode. Alternatively, the top electrode may be used to control the electric potential of the second photoactive layer 12, or in some embodiments may substitute for this layer so that the top electrode is placed directly on top of the first photoactive layer 11. The top electrode may comprise a material selected from the group: Al, In, Mg, Mn, Sb, Y, Ag, Au, Pd, Ni, Al—Zn—O (AZO), In—Sn—O (ITO), Al—Sn—O (ATO), F—Sn—O (FTO), $SnO_2$, organic polymers or hybrids, carbon-based materials such as nanotubes or graphene, etc.

In other words, the photodetector may comprise a conducting or strongly doped top electrode which covers the first photoactive layer at least in the second region on the horizontal substrate surface. This option has not been separately illustrated.

In some embodiments, the photoactive layers 11 and/or 12 may not be necessarily in direct physical/electrical contact with each other, or with the channel 15 and/or the top electrode 17. Specialised layers, or charge carrier selective layers, may be introduced at the interface to decrease or increase the energy barrier for charge carriers. For example, the electron transport layer (ETL), or hole blocking layer (HBL), is a layer which has relatively high electron affinity and high electron mobility, favouring the electron transport. Oppositely, the hole transport layer (HTL), or electron blocking layer (EBL), is a layer which favours a flow of holes across the interface. The specialised interface layers may be also called an electron or hole buffer layer, electron or hole transport material (ETM or HTM), electron or hole injection layer (EIL or HIL), electron or hole injection material (EIM or HIM). The thickness of such carrier transport layers may be in the range 0.5-100 nm.

The specialised layer may comprise a material selected from the groups: inorganic materials such as ZnO, $TiC_2$, $SnO_2$, NiO, $MoC_3$, CuI, CuSCN, etc.; organic small molecules such as BPhen, BCP, NPB, TCTA, TPB, TPBi, $Alq_3$, ZnPc, 2TNATA, m-MTDATA, Spiro-MeCOTAD, C60, PCBM, ICBA, etc.; or organic polymers such as PEDOT: PSS, P3HT, PTAA, Poly-TPD, MEH-PPV, PVK, etc. The specialised layer may be a conductive layer, or a strongly doped semiconductive layer. The same specialised interface layers may be used in the voltage-mode embodiment described below.

In other words, the photodetector may comprise, at least in the second region on the horizontal substrate surface, one or more specialised layers at the interface between the vertical stack of photoactive layers and the measurement layer, and/or one or more specialized layers at the interface between the first photoactive layer and the second photoactive layer, and/or one or more specialized layers at the interface between the vertical stack of photoactive layers and the top electrode. These options have not been separately illustrated.

When the photodetector is illuminated, excitons are generated in the first and second photoactive layers, or in the first photoactive layer only. Holes and electrons are separated from each other by the built-in electric field of the p-i-n heterojunction. If, for example, the conductivity type of the channel 15 is p-type (or ambipolar) and the conductivity type of the second photoactive layer 12 is n-type, then holes will be injected into the channel 15 while electrons accumulate in the depletion region, or at the interface between the first photoactive layer 11 and the second photoactive layer 12. If, on the other hand, the conductivity type of the channel is n-type (or ambipolar) and the conductivity type of the second photoactive layer 12 is p-type, then electrons will be injected into the channel 15 while holes accumulate in the depletion region, or at the 11/12 interface.

In the device illustrated in FIG. 1, the presence of the intrinsic absorption layer (first photoactive layer 11) in the p-i-n heterojunction allows the built-in electric field to extend much further in the vertical direction than a comparable field can extend at p-n or Schottky junction interfaces. The thickness of the exciton-generating region in the first and second photoactive layers 11 and 12 may be 50-5000 nm. Charge carriers released by infrared radiation in this region can be separated. According to Beer-Lambert's law, the light transmittance of a material decreases exponentially as a function of thickness. In this case light which is not transmitted is absorbed. In other words, the amount of infrared light absorbed in the p-i-n phototransistor illustrated in FIG. 1 can be significantly larger than in devices that utilize p-n- or Schottky junctions. This produces a corresponding improvement in quantum efficiency.

As mentioned above, the first photoactive layer 11 may consist of one semiconducting layer which exhibits intrinsic semiconductivity. However, the first photoactive layer may consist of one or more lightly doped p-type sublayers and one or more lightly doped n-type sublayers. The net p-type doping in the first photoactive layer may be approximately equal to the net n-type doping in the first photoactive layer, so that the average conductivity in the first photoactive layer is approximately intrinsic. The first photoactive layer then comprises a lightly doped p-n heterojunction with a staggered band alignment. The thickness of the first photoactive layer 11 may, for example, be in the range 50-5000 nm, or in the range 100 nm-1000 nm, or in the range 200 nm-500 nm.

In other words, the photoactive layer which exhibits intrinsic semiconductivity may be pure intrinsic semiconductor material, or it may comprise a stack of multiple lightly doped sublayers where the net p-type doping in the stack is approximately equal to the net n-type doping in the stack. The photoactive layer may alternatively comprise a material with compensation doping, where the concentration of p-type carriers is approximately equal to the concentration of n-type carriers. The material which exhibits intrinsic semiconductivity may be called a "quasi-i-type semiconductor" if it is either a stack of p-type and n-type layers or a material with compensation doping.

The combined thickness of the photoactive layers where incoming radiation is absorbed can be significantly greater in a p-i-n heterojunction than in pn-junction or Schottky junction devices. Incoming radiation can thereby be captured with a better quantum efficiency.

Figure 2A:
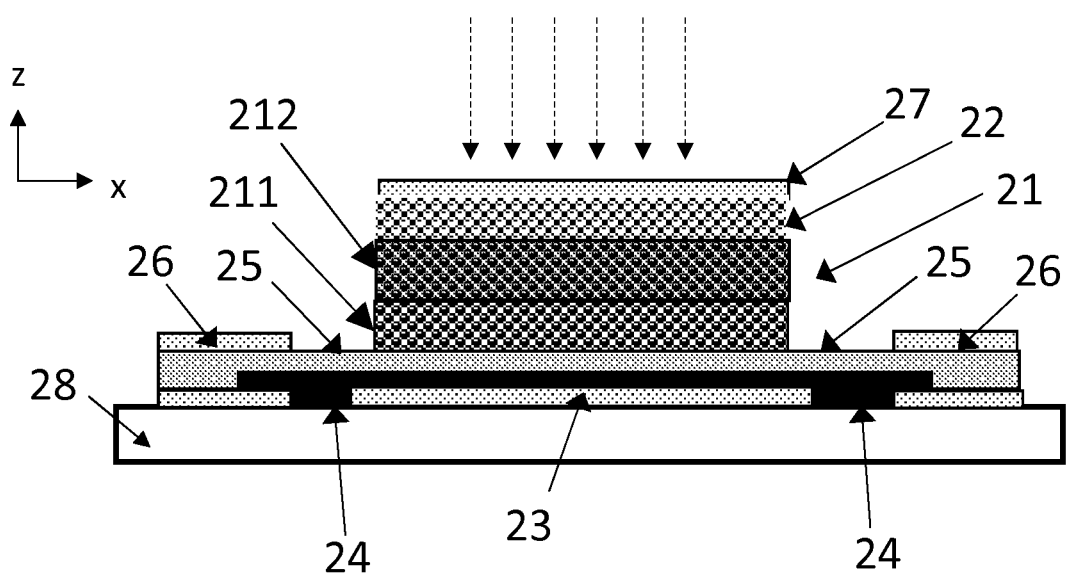
FIG. 2a illustrates a phototransistor with a stack of sublayers in the first photoactive layer.

In other words, the first photoactive layer may contain a stack of sublayers, where each sublayer may contain a different semiconducting material. FIG. 2a illustrates a phototransistor where reference numbers 21-28 correspond to reference numbers 11-18, respectively, in FIG. 1. Reference numbers 211 and 212 indicate a first sublayer 211 and a second sublayer 212 which together form the first photoactive layer 21.

The first sublayer 211 may for example be a lightly doped p-type semiconductor and the second sublayer 212 may be a lightly doped n-type semiconductor. If the first sublayer 211 and the second sublayer 212 are equally thick, the doping concentration $c_1$ of the first sublayer 211 may for example be approximately equal (albeit of opposite type) to the doping concentration $c_2$ of the second sublayer 212. The first photoactive layer 21 as a whole will then exhibit electrical properties similar to those of intrinsic semiconductivity.

Figure 2B:
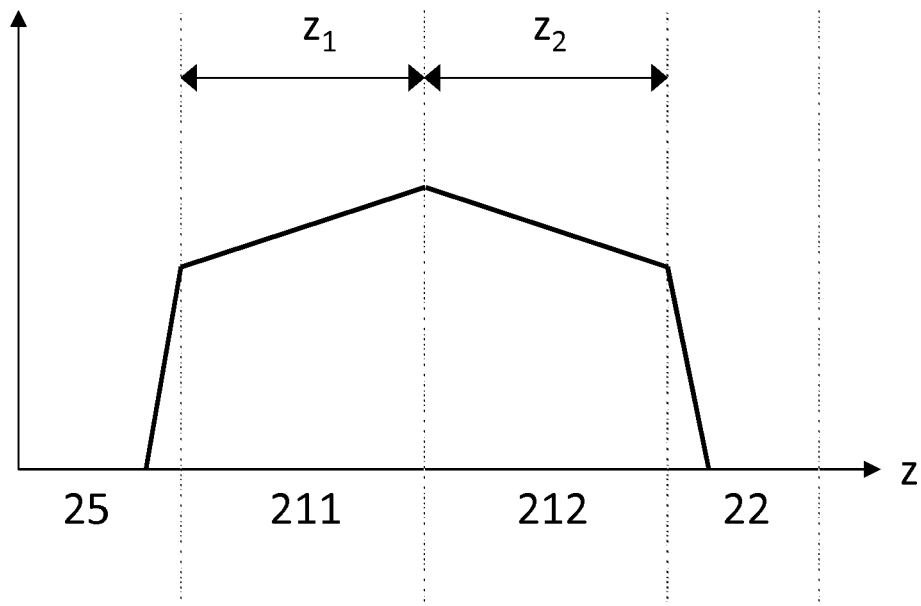
Figure 2C:
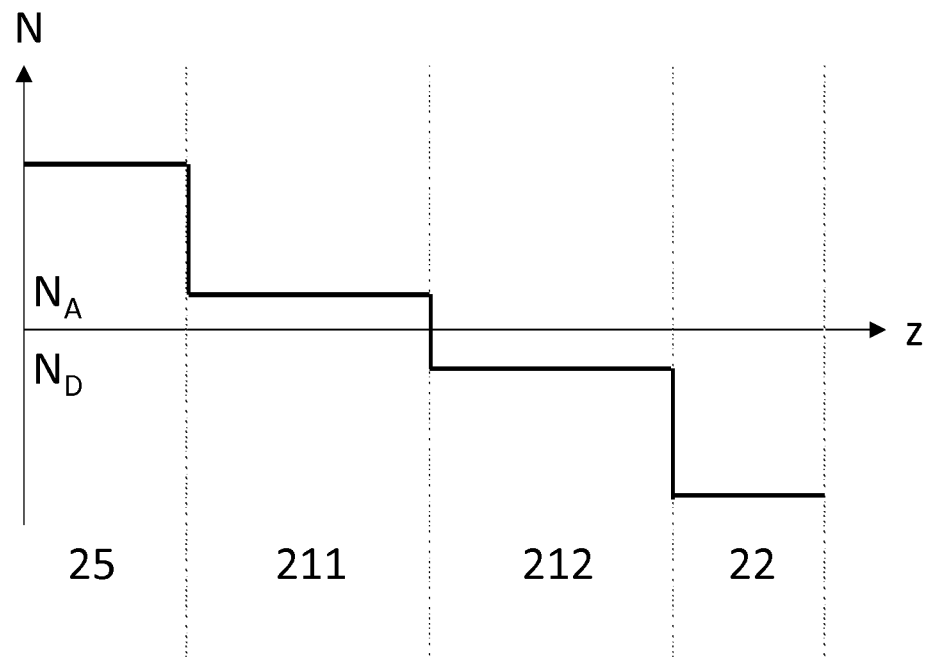
FIGS. 2c and 2e illustrates the charge densities corresponding to FIGS. 2b and 2d, respectively.

FIG. 2b illustrates schematically one example of how the electric field E may depend on the thickness coordinate z in the first and second photoactive layers in the device illustrated in FIG. 2a when the first and second sublayers are of approximately equal thickness, and the doping concentrations are approximately the same (albeit of opposite type). It may be assumed, for the purpose of this example, that the channel 25 is p-doped and the second photoactive layer 22 is n-doped. The electric field E is illustrated as a function of vertical height z. Light doping produces an electric field with a relatively small gradient in the first and second sublayers 211 and 212. The gradient changes sign at the 211/212 interface. FIG. 2c illustrates the corresponding charge density N as a function of vertical height z, the acceptor density in the first sublayer 211 is approximately equal to the donor density in the second sublayer 212. The doping level in the first sublayer 211 is lower than in the channel 25, and the doping level in the second sublayer 212 is lower than in the second photoactive layer 22.

Alternatively, if the thickness of the first sublayer 211 is $z_1$, and it differs from the thickness $z_2$ of the second sublayer 212, then the product $z_1 \cdot c_1$ may for example be approximately equal to the product $z_2 \cdot c_2$. Assuming that the sublayers 211 and 212 have the same horizontal area, the first photoactive layer 21 as a whole will then exhibit electrical properties similar to those of intrinsic semiconductivity. In other words, by selecting the conductivity and thickness of each sublayer suitably, the amount of valence-band holes in the lightly doped p-type sublayer can be made approximately equal to the amount of conduction-band electrons in the lightly doped n-type sublayer, and the first photoactive layer 21 can be made approximately intrinsic.

Figure 2D:
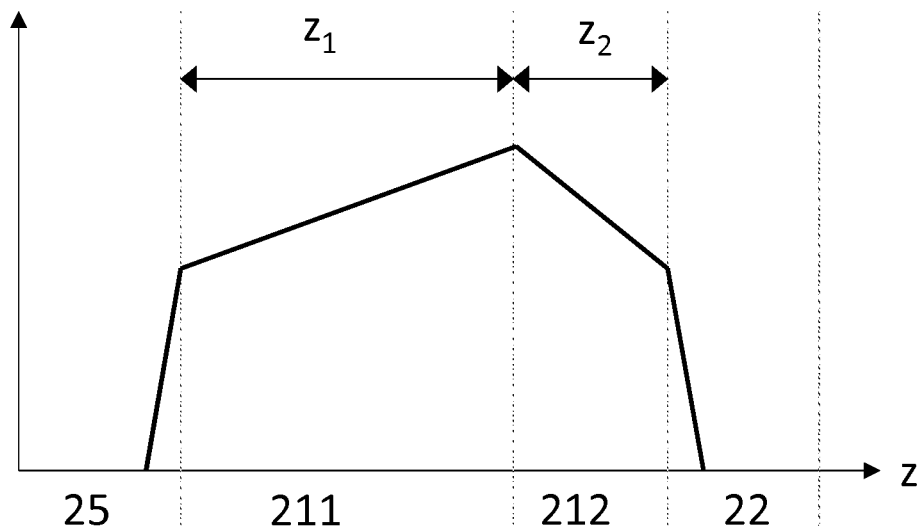

FIG. 2d illustrates schematically one example of how the electric field E may depend on the thickness coordinate z in the first and second photoactive layers in the device illustrated in FIG. 2a when the first and second sublayers have different thicknesses. It is again assumed that the channel 25 is p-doped and the second photoactive layer 22 is n-doped. The electric field E is illustrated as a function of vertical height z. The doping concentration is lower in the first sublayer 211 than in the second sublayer 212. The gradient of the electric field changes sign at the 211/212 interface, and its absolute value is smaller in sublayer 211 than in sublayer 212.

Figure 2E:
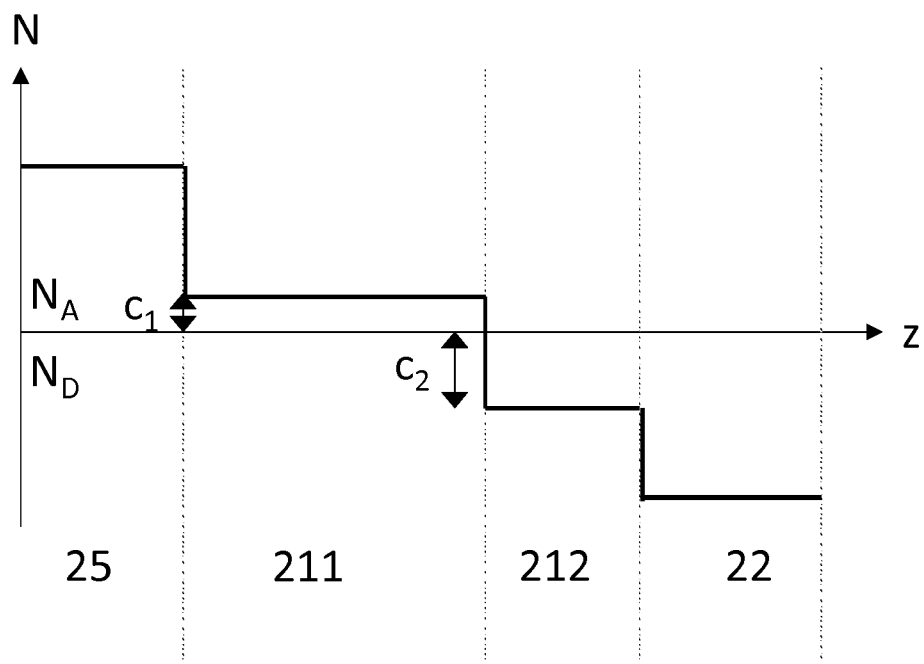

FIG. 2e illustrates the corresponding charge density N as a function of vertical height z. The acceptor density in the first sublayer 211 is half of the donor density in the second sublayer 212. Since the thickness $z_1$ of the first sublayer 211 is approximately twice as large as the thickness $z_1$ of the second sublayer 212, the net balance between the charges approximates intrinsic semiconductivity.

In other words, an electrical balance which is close to intrinsic semiconductivity may be achieved when the product of charge density and layer thickness is approximately the same in the first sublayer 211 and the second sublayer 212. The net p-type doping in the first photoactive layer is then approximately equal to the net n-type doping in the first photoactive layer. In principle, this corresponds to a situation where the number of free valence-band holes in sublayer 211 is approximately equal to the number of free conduction-band electrons in sublayer 212 when the device is not illuminated (although exact equality is rarely achieved in practice when very large numbers of charge carriers are involved).

These considerations on p-i-n heterojunctions, where the channel is p-doped, apply also to n-i-p heterojunctions where the channel is n-doped. However, in that case sublayer 211, which is closer to the channel 25, would be n-type. Sublayer 212, which is in this case closer to the strongly p-doped second photoactive layer 22, would then be p-type.

The first photoactive layer may alternatively comprise more than two sublayers. It may for example comprise alternate lightly p-doped and lightly n-doped layers, or a stack of sublayers where the doping concentrations gradually changes from bottom of the stack to the top, or vice versa, for example from moderate p-type to mild p-type, then to mild n-type and moderate n-type, and so on. Doping concentrations may be selected so that the net p-type doping in the first photoactive layer becomes approximately equal to the net n-type doping in the first photoactive layer. The first photoactive layer as a whole can then exhibit electrical properties that correspond to intrinsic semiconductivity.

Voltage-Mode Embodiment

The measurement layer may alternatively be a charge accumulation electrode, and the photodetector may comprise a single-ended measurement electrode connected to the charge accumulation electrode. The photodetector may then be configured to measure the intensity of incoming radiation by determining the magnitude of the electric potential of the charge accumulation electrode. This electric potential is modulated by the photoactive layer when it absorbs radiation.

The charge accumulation electrode is in this case a two-dimensional layered material, such as graphene or one of the other two-dimensional materials listed in the transistor embodiment above.

Figure 3:
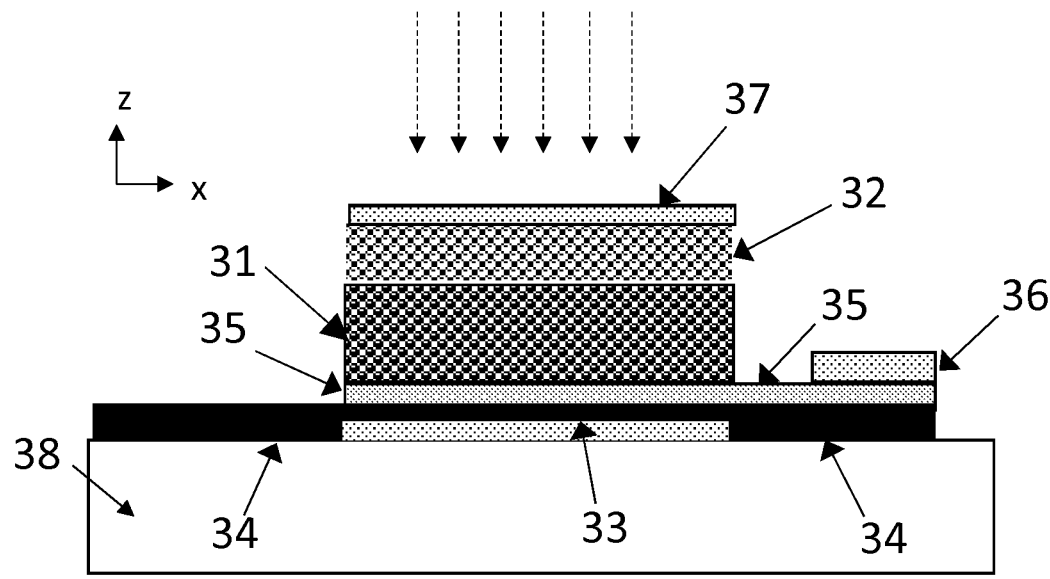
FIG. 3 illustrates a voltage-mode device.

FIG. 3 illustrates a voltage-mode device where the measurement layer functions as a charge accumulation electrode. Reference numbers 31-34 and 37-38 correspond to reference numbers 11-14 and 17-18 in FIG. 1. The charge accumulation electrode 35 covers the insulating layer 34 and the gate electrode 33 in the same manner as in the phototransistor embodiment, and photoactive layers 31-32 and top electrode 37 are also stacked on top of the charge accumulation electrode 35 in the same manner. The voltage-mode device also comprises a single-ended measurement electrode 36 which may be connected to any side or any end of the charge accumulation electrode.

In a voltage-mode device, the photoactive layers 31-32 operate in a manner which is similar to their operation in a phototransistor. When electromagnetic radiation is absorbed in the photoactive layers, a portion of the electron-hole pairs released by the radiation are separated by the internal electric field. The released charge carriers which remain in the photoactive layers are trapped in this layer. The concentration of these trapped charge carriers will typically be proportional to the intensity of incident electromagnetic radiation, at least under low illumination intensities.

On the other hand, the charge carriers of opposite type, which are released by radiation and then transferred across the 31/35 interface before they have a chance to recombine, change the charge density of the charge accumulation electrode. It is a unique property of two-dimensional layered materials that the additional charge transferred across the interface changes the charge density per unit area of the two-dimensional material to an extent which can be measured.

The charge-accumulation electrode may be configured to n-type conductivity, p-type conductivity, or ambipolar conductivity, just like the transistor channel in the phototransistor embodiment.

The single-ended measurement electrode can be used to determine the electric potential of the charge accumulation electrode. In this disclosure, the term "single-ended measurement electrode" means an electrode which is configured to transmit the electric potential of the charge accumulation electrode to external measurement circuitry. The term "single-ended" also means that the measurement electrode is not paired with another measurement electrode connected to the charge accumulation electrode.

Even so, multiple measurement electrodes can be connected to the charge accumulation electrode for backup purposes, for example. But even if more than one measurement electrode is connected to the charge accumulation electrode, they must be configured for a single-ended measurement if they are to be used for determining the potential of the charge accumulation electrode. A single-ended measurement electrode is connected to a readout circuit configured for measuring electric potential It is not paired with other measurement electrodes connected to the same charge accumulation electrode.

All portions of the charge accumulation electrode are at the same potential when the measurement is made. In contrast, in the transistor embodiment presented above, where the variable of interest is a current passing through the transistor channel, a single-ended measurement electrode would be insufficient for performing the measurement. A double-ended source-drain electrode pair is in that case needed for setting a potential difference across the transistor channel and measuring a current.

In other words, one single-ended measurement electrode connected to the charge accumulation electrode is sufficient for outputting a voltage signal, proportional to incident radiation intensity, to the external readout circuitry connected to the photodetector. The readout circuit may be configured to measure the voltage between the single-ended measurement electrode and a reference potential. The single-ended measurement electrode may also be called a single measurement electrode.

All considerations relating to first and second regions in the phototransistor embodiment apply to this voltage-mode embodiment as well. All considerations relating to the composition, materials and electrical properties of the first and second photoactive layers in the phototransistor embodiment apply to this voltage-mode embodiment as well. In particular, the ordering of n-type, i-type and p-type layers in a voltage-mode device should follow the scheme presented in the phototransistor embodiment above. The bandgaps, thicknesses and materials of the photoactive layers may be the same as in the phototransistor embodiment. In other words, the photoactive layers may comprise semiconductor nanocrystals, nanoparticles, colloidal quantum dots or thin-film semiconducting layers with a crystalline or amorphous structure, as specified in the phototransistor embodiment.

All two-dimensional layered materials listed in the phototransistor embodiment can be used in the charge accumulation electrode. The two-dimensional layered material may comprise 1-10 atomic layers, with the total thickness ranging from 0.3 nm to 10 nm. Alternatively, the charge accumulation electrode 35 may be a metal electrode, for example a layer of Al, Pd, Au, Ag or any other metallic material. If the charge accumulation electrode 35 is a metal electrode, the device may be operated as an open-circuit photodiode.

The first photoactive layer 31 may exhibit intrinsic semiconductivity in any manner explained in the phototransistor embodiment, including the manner illustrated in FIG. 2a. The optional top electrode 37 may perform the same function in the voltage-mode embodiment as in the phototransistor embodiment.

Additional Embodiments

Any photodetector described in this disclosure may form one pixel in a radiation sensor which may comprise multiple pixels of the same kind. The radiation sensor may also comprise a control unit which is configured to apply a gate voltage to the gate electrode and/or a top electrode voltage to the top electrode.

If the photodetector is a phototransistor, the control unit may also be configured to apply a source-drain voltage across the source and drain electrodes to drive the source-drain current between them. The control unit may also be configured to measure and store a continuous signal of source-drain current values measured from each photodetector pixel.

If the photodetector is a voltage-mode device, the control unit may be configured to measure the electric potential of the charge accumulation layer through the measurement electrode, for example by comparing it to a reference potential. The control unit may also be configured to measure and store a continuous signal of electric potential values measured from each photodetector pixel.

The p-i-n photodetector may be equipped with an electrical shutter mechanism, implemented by configuring the control unit to switch the photodetectors in the radiation sensor between a light-sensitive state and a light-immune state. The gate electrode and/or top electrode may be used for controlling the magnitude of the photoresponse.

This disclosure also relates to a method for sampling a response signal from a photodetector which can be configured to provide an electrical response when illuminated by electromagnetic radiation incident on the detector. The photodetector may comprise the any of the phototransistor structures described above.

The method may comprise the step of measuring first signal values from the phototransistor pixels in a light-sensitive state by setting the gate voltage and/or the top electrode voltage in each phototransistor pixel to a value which makes the built-in voltage in the p-i-n heterojunction equal or nearly equal to its maximum value. The method may also comprise the step of measuring corresponding second signal values from the phototransistor pixels in a light-immune state by setting the gate voltage and/or the top electrode voltage in each phototransistor pixel to a value which makes the built-in voltage in the p-i-n heterojunction equal or nearly equal to zero.

In this context, the "corresponding" second signal value may refer to a value which is paired with the first signal value in one correlated-double-sampling measurement.

The control unit may alternatively be configured to apply an AC voltage, for example with a sinusoidal waveform, to the top electrode, or the gate electrode. This oscillating voltage can produce an output signal which oscillates between a light-immune state and a state of maximum light sensitivity. The control unit may be configured to measure the source-drain current several times during each waveform period. The control unit may be configured to aggregate the measurement data obtained through sampling the output signal in different phases of the AC voltage oscillation cycle. This aggregation can yield a more accurate measure of the intensity of incoming radiation than measurements conducted only in the light-immune state and in a state of maximum light sensitivity.

The phototransistor may be encapsulated with a dielectric layer which covers any of the structures presented in this disclosure. This simple encapsulation scheme has not been illustrated. An alternative scheme can be implemented to minimize leakage currents in devices where the second photoactive layer has been omitted and a thin dielectric layer has been placed over the first photoactive layer, and a top electrode has been placed over the dielectric layer. The top electrode may in this case capacitively modulate the depletion region in the first photoactive layer.

Figure 4:
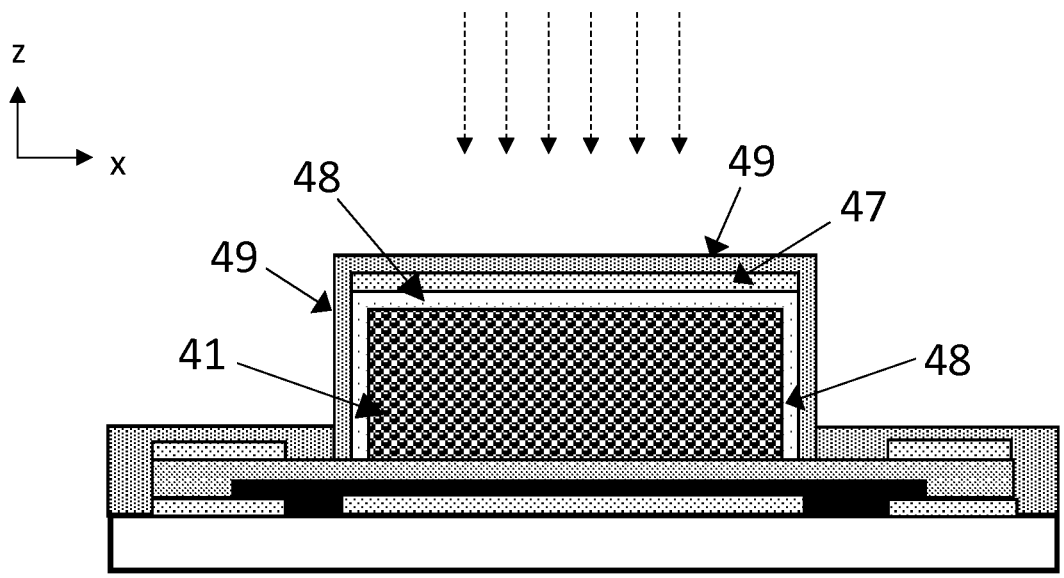
FIG. 4 illustrates encapsulation.

FIG. 4 illustrates this alternative encapsulation scheme. The photodetector comprises a thin dielectric layer 48 on top of the first photoactive layer 41. The top electrode 47 covers the thin dielectric layer 48 and a thick dielectric layer 49 encapsulates all layers. Either or both of the dielectric layers 48 and 49 may in practice also cover the vertical sidewalls of the stack of photoactive layers (as illustrated in FIG. 4), as well as other parts of the horizontal substrate.

The invention claimed is:

1. A photodetector which comprises:
a substrate with a horizontal substrate surface,
an electrically conducting gate electrode which defines a first region on the horizontal substrate surface, and an insulating layer which covers the gate electrode in the first region on the horizontal surface,
a measurement layer which covers the insulating layer at least in the first region on the horizontal substrate surface,
a vertical stack of photoactive layers which comprises at least a first photoactive layer which covers the measurement layer at least in a second region on the horizontal substrate surface, wherein the second region at least partly overlaps with the first region,
wherein the first photoactive layer comprises semiconductor nanocrystals, nanoparticles or colloidal quantum dots, the conductivity type of the measurement layer is n-type, p-type or ambipolar, and the first photoactive layer exhibits intrinsic semiconductivity, and
the first photoactive layer comprising one or more lightly doped p-type sublayers and one or more lightly doped n-type sublayers, and the net p-type doping in the first photoactive layer is approximately equal to the net n-type doping in the first photoactive layer, so that the average conductivity in the first photoactive layer is approximately intrinsic.

2. The photodetector according to claim 1, wherein the photodetector further comprises a conducting or strongly doped top electrode which covers the first photoactive layer at least in the second region on the horizontal substrate surface.

3. The photodetector according to claim 1, wherein the vertical stack of photoactive layers further comprises a second photoactive layer which covers the first photoactive layer at least in the second region on the horizontal substrate surface; wherein the second photoactive layer comprises semiconductor nanocrystals, nanoparticles or colloidal quantum dots, and:
the conductivity of the measurement layer is n-type and the conductivity of the second photoactive layer is p-type, or
the conductivity of the measurement layer is p-type and the conductivity of the second photoactive layer is n-type, or
the conductivity of the measurement layer is ambipolar and the conductivity of the second photoactive layer is either n-type or p-type.

4. The photodetector according to claim 3, wherein the photodetector further comprises a conducting or strongly doped top electrode which covers the second photoactive layer at least in the second region on the horizontal substrate surface.

5. The photodetector according to claim 1, wherein the photodetector further comprises, at least in the second region on the horizontal substrate surface, one or more specialised layers at the interface between the vertical stack of photoactive layers and the measurement layer, or one or more specialized layers at the interface between the first photoactive layer and the second photoactive layer, or one or more specialized layers at the interface between the vertical stack of photoactive layers and the top electrode.

6. The photodetector according to claim 1, wherein the measurement layer is a transistor channel and the photodetector comprises source and drain electrodes connected to different sides of the transistor channel, so that the photodetector can be configured to measure the intensity of incoming radiation by determining the magnitude of a source-drain current which is driven through the measurement layer between the source and drain electrodes and modulated by the photoactive layer when it absorbs radiation.

7. The photodetector according to claim 1, wherein the measurement layer is a charge accumulation electrode, and the photodetector comprises a single-ended measurement electrode connected to the charge accumulation electrode, so that the photodetector can be configured to measure the intensity of incoming radiation by determining the magnitude of the electric potential of the charge accumulation electrode, which is modulated by the photoactive layer when it absorbs radiation.

* * * * *